(12) United States Patent
DiFonzo

(10) Patent No.: US 10,224,392 B1
(45) Date of Patent: Mar. 5, 2019

(54) METHOD OF FABRICATING A SEMICONDUCTOR CAPACITOR

(71) Applicant: The United States of America as represented by the Director, National Security Agency, Washington, DC (US)

(72) Inventor: Peter A. DiFonzo, New Windsor, MD (US)

(73) Assignee: The United States of America as represented by the Director, National Security Agency, Washington, DC (US)

( * ) Notice: Subject to any disclaimer, the term of this patent is extended or adjusted under 35 U.S.C. 154(b) by 0 days.

(21) Appl. No.: 15/206,529

(22) Filed: Jul. 11, 2016

(51) Int. Cl.
*H01L 49/02* (2006.01)

(52) U.S. Cl.
CPC .................... *H01L 28/60* (2013.01)

(58) Field of Classification Search
CPC ........................................................ H01L 28/60
See application file for complete search history.

(56) References Cited

U.S. PATENT DOCUMENTS

| | | | | |
|---|---|---|---|---|
| 4,672,410 A * | 6/1987 | Miura | ................. | H01L 21/2257 257/302 |
| 4,888,820 A * | 12/1989 | Chen | ................. | H01G 4/20 257/301 |
| 5,192,703 A * | 3/1993 | Lee | ................. | H01L 27/10817 257/E21.019 |
| 5,244,427 A * | 9/1993 | Umeya | ................. | G02F 1/13334 427/66 |
| 5,837,576 A * | 11/1998 | Chen | ................. | H01L 27/10852 257/E21.011 |
| 6,071,815 A * | 6/2000 | Kleinhenz | ......... | H01L 21/31111 257/E21.008 |
| 6,127,070 A * | 10/2000 | Yang | ................. | H01L 21/0274 257/E21.027 |
| 6,165,567 A * | 12/2000 | Ventzek | ................. | C23C 14/046 204/192.1 |
| 6,432,770 B2 * | 8/2002 | Lin | ................. | H01L 28/40 257/E21.008 |
| 6,995,070 B2 * | 2/2006 | Seo | ................. | H01L 28/91 257/E21.019 |
| 10,062,609 B2 * | 8/2018 | You | ................. | H01L 21/76802 |

(Continued)

*Primary Examiner* — Dale E Page
*Assistant Examiner* — Quovaunda Jefferson

(57) ABSTRACT

A method of fabricating a semiconductor capacitor is disclosed. The method includes forming a first trench in a semiconductor substrate, forming a dielectric lining layer in the first trench, and depositing a first capacitor conductor plate layer on the dielectric lining layer. The method also includes forming a second trench such that the dielectric lining layer is exposed. The method also includes forming a third trench such that the dielectric lining layer is exposed within the third trench. The method also includes depositing a second capacitor conductor plate layer in the second trench and depositing a third capacitor conductor plate layer in the third trench. The method also includes forming a first electrical contact between the first capacitor conductor plate layer and the second capacitor conductor plate layer and forming a second electrical contact between the first capacitor conductor plate layer and the third capacitor conductor plate layer.

14 Claims, 10 Drawing Sheets

(56) References Cited

U.S. PATENT DOCUMENTS

2012/0181658 A1* 7/2012 Mohammed ............ H01G 4/06
　　　　　　　　　　　　　　　　　　　257/532
2014/0374878 A1* 12/2014 Leobandung ........... H01L 28/40
　　　　　　　　　　　　　　　　　　　257/532

* cited by examiner

METHOD OF FABRICATING A SEMICONDUCTOR CAPACITOR

FIELD OF INVENTION

The present invention relates, in general, to semiconductor device manufacturing and, in particular, to trench capacitor fabrication.

BACKGROUND

When an integrated system draws more electrical power than is available, the power supply voltage provided to the integrated system drops. To meet temporary demands for greater energy than may be supplied by a power supply, large capacitors are used to store the necessary energy and provide it to the integrated system when needed. In some cases, an electrode of a semiconductor trench capacitor may be made from polycrystalline silicon or heavily doped silicon. Such materials may display a relatively high resistance, which can limit the amount of current that the capacitor can supply. In addition, the dielectric layer of a prior art semiconductor trench capacitor may be formed by chemical vapor deposition (CVD). CVD is a relatively low temperature process (e.g., 600 degrees Celsius). At such a temperature, the resulting dielectric may exhibit a large defect density.

SUMMARY

One embodiment of the present invention is a method of fabricating a semiconductor capacitor. The method includes forming a first trench in a semiconductor substrate, forming a dielectric lining layer in the first trench, and depositing a first capacitor conductor plate layer on the dielectric lining layer in the first trench. The method also includes forming a second trench in the semiconductor substrate such that the dielectric lining layer is exposed within the second trench and forming a third trench in the semiconductor substrate such that the dielectric lining layer is exposed within the third trench. The method also includes depositing a second capacitor conductor plate layer in the second trench and depositing a third capacitor conductor plate layer in the third trench. The method also includes forming a first electrical contact between the first capacitor conductor plate layer and the second capacitor conductor plate layer and forming a second electrical contact between the first capacitor conductor plate layer and the third capacitor conductor plate layer.

DETAILED DESCRIPTION

Figure 1:
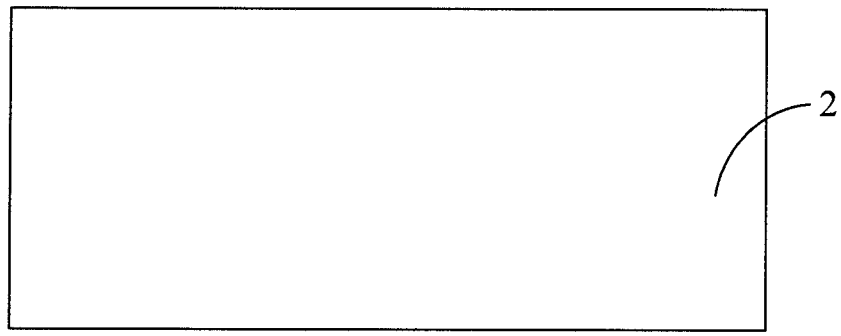
FIGS. 1-18 are cross-sectional views of a semiconductor substrate at various stages during fabrication of a trench capacitor in accordance with an embodiment of the present invention.

Using deep reactive ion etch (DRIE) of silicon for through silicon vias (TSV), coupled with dual damascene interconnect methodologies, it is possible to build custom, thermally matched, electro-mechanical substrates for which bare die integrated circuits (ICs) can be attached forming a heterogeneous integrated system. These silicon substrates can also be fabricated to include passive elements for signal and power conditioning and direct current (DC) power source decoupling for high performance high switch count integrated systems. High performance, high switch count integrated systems can suffer from on-chip brown-outs if the power source cannot supply sufficient current during maximum switching events. This may be alleviated by connecting large value capacitors across the power and ground connections such that during short, high current demand periods, the capacitors supply the additional current, thus decoupling the power source from the IC.

Conventional methods of forming embedded capacitors, both vertical and planar within a silicon substrate, may include the following. One of the conductor plates of the capacitor may be doped polycrystalline silicon deposited through chemical vapor deposition techniques, or heavily doped silicon substrate.

The dielectric layer may be a low temperature chemically deposited film, such as SiO, or SiN. Plate conductors may have limited post process thermal budgets, and thus the dielectric layer over these conductor metals may be made through low temperature CVD. Plate conductors may thus have limited thermal budgets before undergoing catastrophic failure in the form of melting or diffusing into the substrate.

Polycrystalline silicon is rough, has a high defect density due to the nature of CVD and has high electrical resistance when compared to materials such as copper or aluminum thus limiting the current carrying capacity. Furthermore, conventional dielectric layers may suffer from high defect density due to the nature of the CVD process and higher degree of porosity, and low degree of long-range single crystal grain structure thus resulting in a lower effective dielectric constant and lower breakdown field strength. All of these factors can contribute to the poor reliability of conventional embedded decoupling capacitors.

Factors in the formation of a capacitor include the dielectric constant, the thickness of the dielectric layer, and the effective geometric area. Other contributing factors that influence the reliability and manufacturability of capacitors include defect density of the dielectric layer and the plate conductor make-up. In accordance with embodiments of the present invention, high density vertical capacitors may be formed in a silicon substrate through a series of processes for which the dielectric is formed using optimized methods with minimal interference from fabrication of the conductor plates. The formation of the dielectric layer is done first, using the ultra-pure environment typical in front-end-of-line (FEOL) processing. This process can take the form of thermal oxidation in an ultra-pure furnace plumbed with pure oxygen. Upon forming the dielectric layer, subsequent interconnect fabrication processes can form the conductor plates that compile the basic capacitor elements. Further interconnect fabrication allows these capacitors to be wired in such a way as to maximize the total capacitance value and their eventual connection to the power and ground connections of an IC through flip-chip attached to the substrate.

Figure 19:
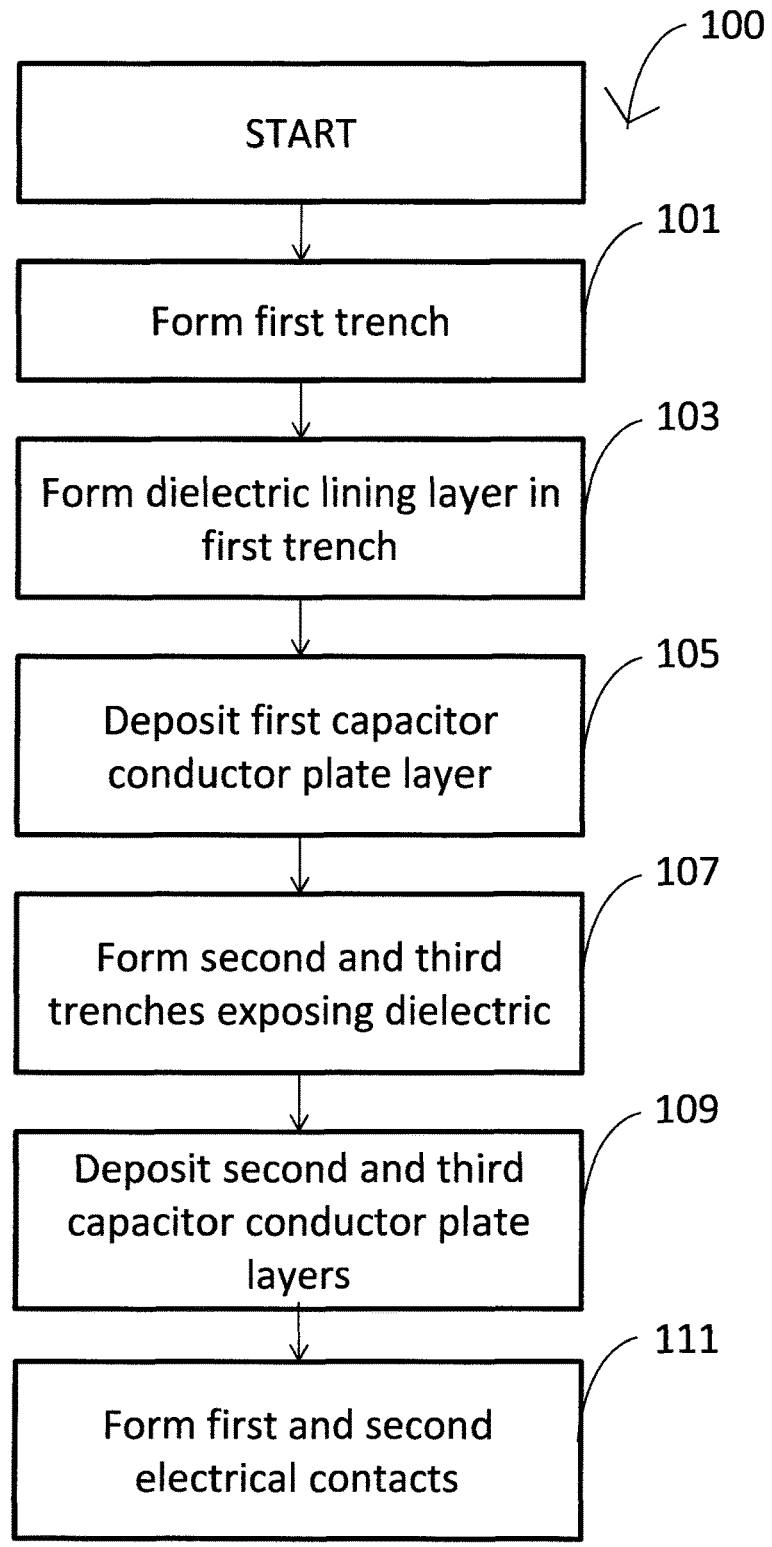
FIG. 19 is a flow chart in accordance with an embodiment of the present invention.

A process 100 of fabricating a capacitor in accordance with an embodiment of the present invention is now described with reference to FIG. 19. As noted above, the capacitor may be fabricated such that the capacitor conductor plates and the dielectric layer are formed with minimal fabrication interference with one another. In particular, the dielectric may be formed fully, prior to addition of conductive material. Accordingly, high-temperature fabrication processes may be used, resulting in reduced dielectric defect density relative to a dielectric formed by CVD. Similarly, highly conductive materials may be used, which can result in a capacitor having conductor electrodes with low resistance. The process begins at block 101, where a first trench is formed in a semiconductor substrate 2, such as is shown in FIG. 1. in a cross-sectional view. The forming of the first trench 4 in accordance with an exemplary embodiment is shown in detail in FIGS. 2-4. In some embodiments, the semiconductor substrate 2 may be silicon. In other embodiments germanium may be used. Other appropriate foundation material known in the art also may be used in other embodiments.

Figure 2:
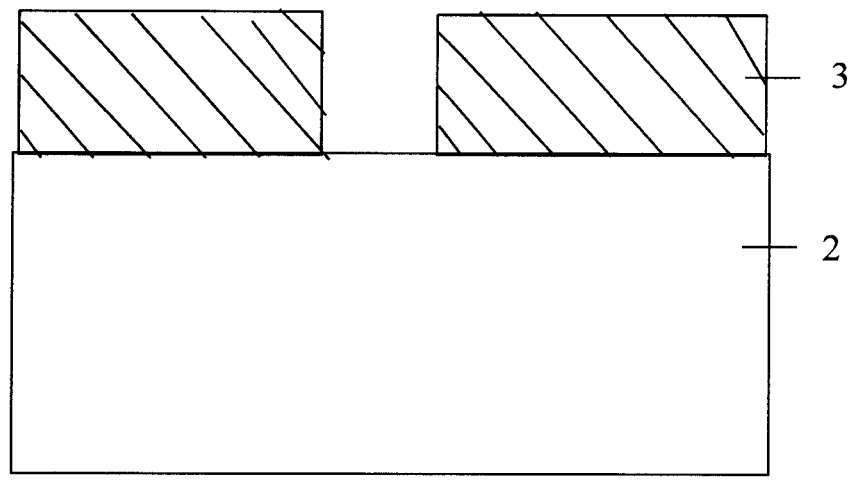

As shown in FIG. 2, the forming of the first trench 4 begins by applying a first mask layer 3 to the substrate 2. The first mask layer 3 defines an area where the first trench is to be formed. Specifically, as is understood in the art generally, a mask layer can be applied to a substrate in areas where trenching is not to occur, while an area to be trenched is left unmasked. A mask may be formed by depositing a sacrificial dielectric material, depositing a photo-sensitive organic material, photo-engraving the organic material, and then etching the sacrificial dielectric material to expose the substrate.

Figure 3:
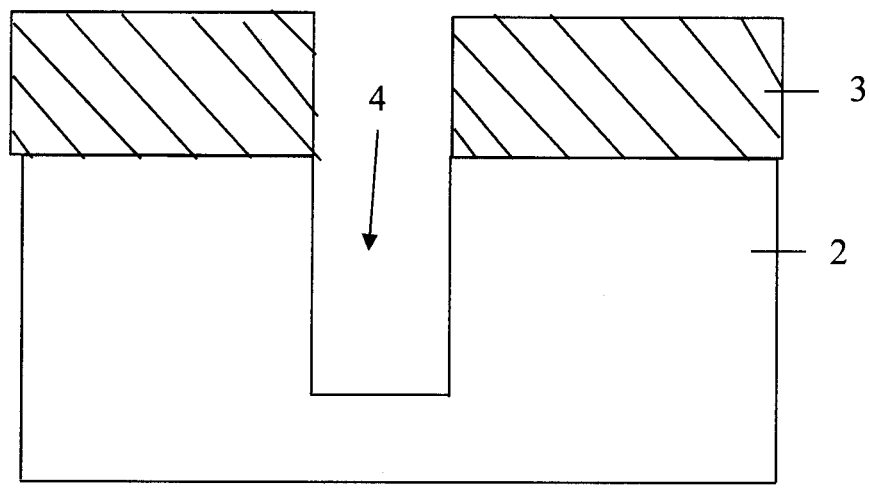
Figure 4:
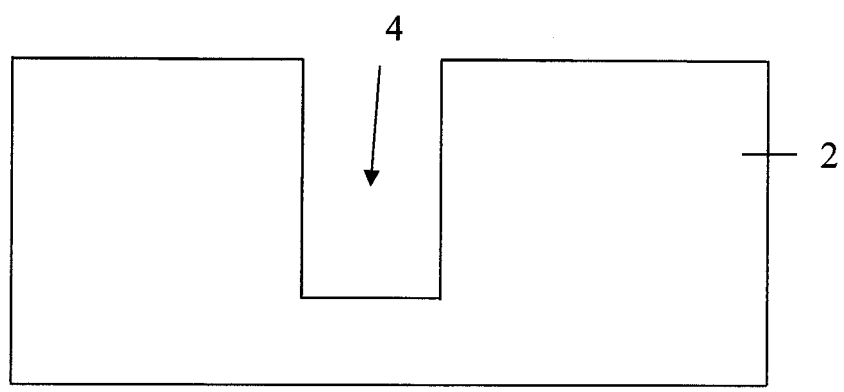

The trench 4 may be formed, as shown in FIG. 3, by processes including chemical etching and mechanical grinding. In some embodiments, an N-doped layer or P-doped layer (not shown) may be ion implanted into the semiconductor substrate 2 at the bottom of the first trench 4 to reduce the parasitic resistance of the trench capacitor that will result from the fabrication process. As shown in FIG. 4, after the trench 4 has been formed, the first mask layer is removed, e.g., using similar techniques to those used for forming the trench, thus leaving bare substrate surfaces exposed.

Figure 5:
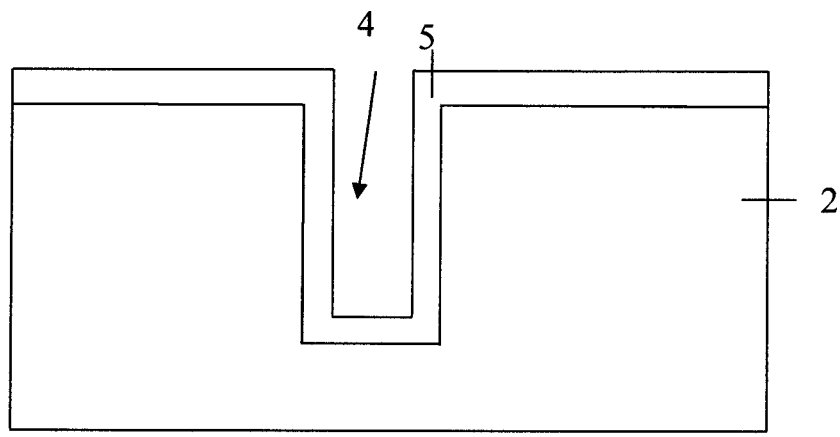

The process continues at block 103, where a dielectric lining layer 5, shown in FIG. 5, is formed in the first trench 4. In practice, the manufacturing method used in forming the dielectric lining layer 5 may result in the dielectric being formed on the top surface of the substrate in addition to the interior of the trench. According to one embodiment, the dielectric 5 may be formed by depositing a metal such as tantalum on the surface of the substrate 2, including both the horizontal top surface as well as the sides and bottom of the first trench 4. After this initial deposition, the metal may be exposed to a controlled oxidizing environment to form a dielectric comprising tantalum pentoxide ($Ta_2O_5$). The tantalum may be fully oxidized so that only tantalum pentoxide is present or partially oxidized so that a sandwich of tantalum pentoxide and tantalum are present. In other embodiments, the substrate including the trench 4 may be exposed to a controlled oxidizing environment to form a dielectric comprising silicon dioxide ($SiO_2$). The oxidizing process may be performed in a pure oxygen environment in a temperature range of 800 degrees Celsius to 1200 degrees Celsius.

As inspection of FIG. 5 shows, according to the presently described method, a dielectric layer may be formed prior to the introduction of any of the conductive materials that will eventually be included in the capacitor. As a result, the dielectric may be formed as described above in a high temperature, substantially pure oxygen environment. While such conditions might damage conventional conductors, such as copper, the conductors are not yet present. Accordingly, the resulting dielectric may have a significantly lower defect density than a dielectric that might be formed according to conventional methods in an environment where a copper conductor has already been formed. The dielectric may thus exhibit desirable characteristics such as reduced defect induced leakage and a higher or more stable effective dielectric constant.

Another significant consequence of the present approach is that the dielectric 5 may be as thin as such high-precision manufacturing methods allow. As will become apparent, at no point in the manufacturing process will the dielectric layer be required to stand independently, supporting its own weight and resisting on its own damage from environmental shock waves. This thinness of the dielectric layer in turn allows for a higher capacitance to be achieved.

Figure 6:
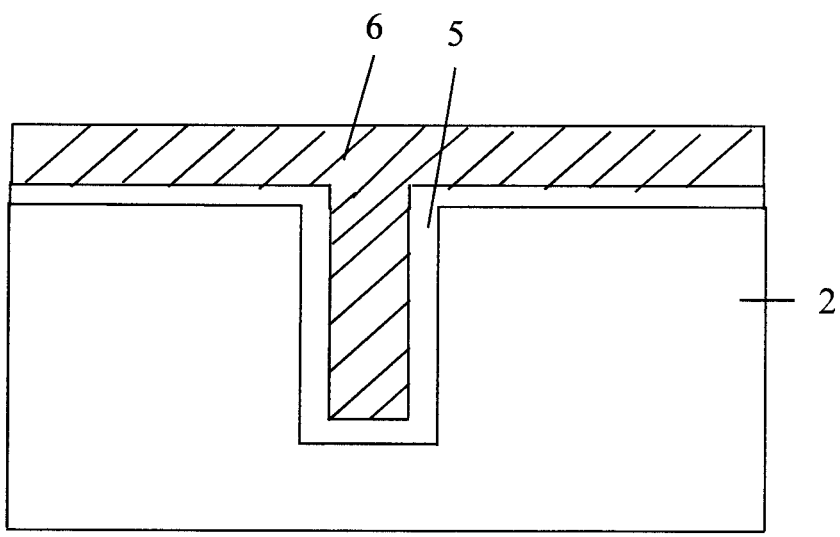
Figure 7:
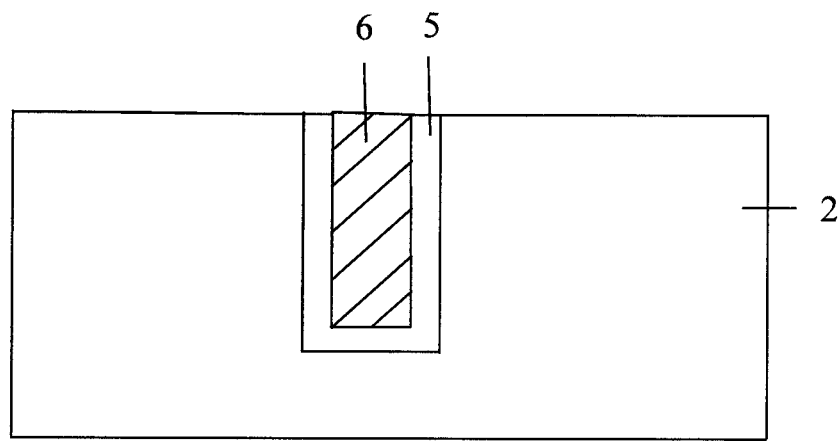

The process continues at block 105, where a first capacitor conductor plate layer is deposited. The conductor may be copper, according to some embodiments, though other conductive materials may be chosen as appropriate. The conductor may be formed by depositing a seed conductor layer using chemical vapor deposition, followed by electroplating (e.g. Cu). As shown in FIG. 6, in practice, the manufacturing method used in applying the conductor 6 may result in the conductive material being applied to the top surface of the substrate in addition to the interior of the trench. Once the conductive material has been applied, the top surface of the substrate may again be cleared/smoothed, e.g., by chemical-mechanical polishing (CMP). The result of such clearing can be seen in FIG. 7. The top surface now may be evenly smoothed across the substrate 2, the dielectric 5, and the conductor 6.

Figure 8:
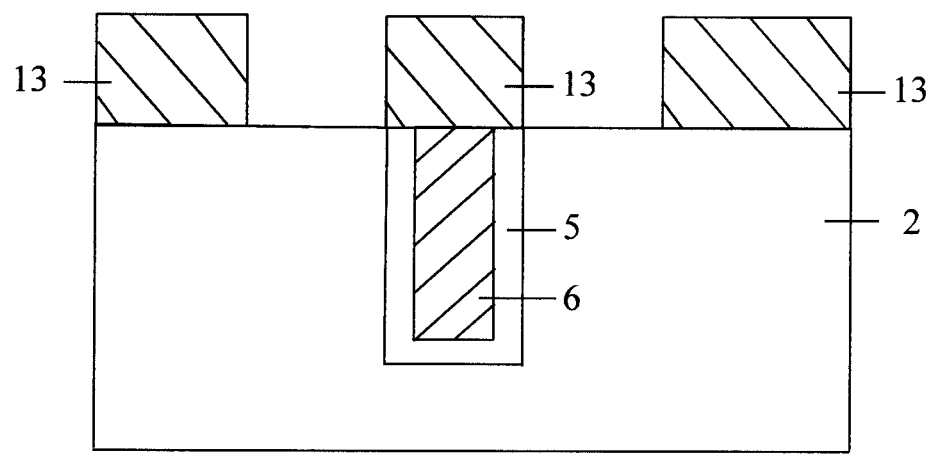
Figure 9:
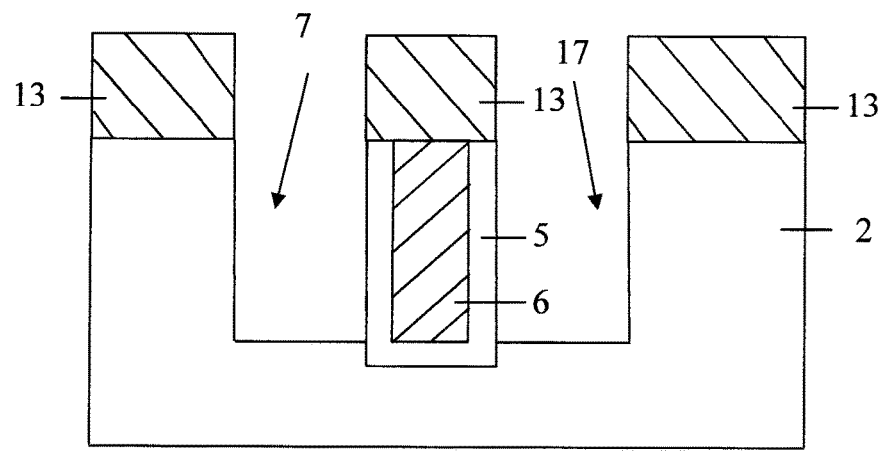
Figure 10:
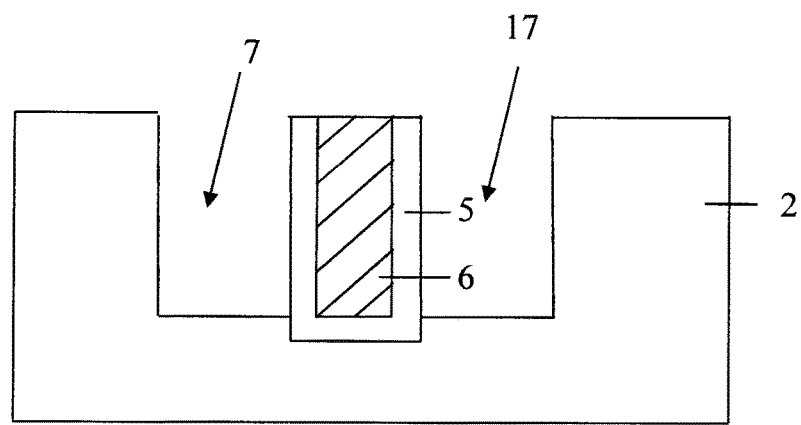

The process continues at block 107, where second and third trenches are formed in the substrate. The second and third trenches are formed, one on either side of the dielectric 5. As before, the process of forming trenches may begin with application of a second mask layer 13, as shown in FIG. 8. The trenches 7, 17, which will later house conductive material of the capacitor, can extend laterally all the way to the surface of the dielectric, such that surfaces of the dielectric are exposed temporarily in the interior of the trenches, as shown in FIG. 9. Once the trenches 7, 17 have been formed, the mask layer 13 can be removed, resulting in the configuration shown in FIG. 10.

Figure 11:
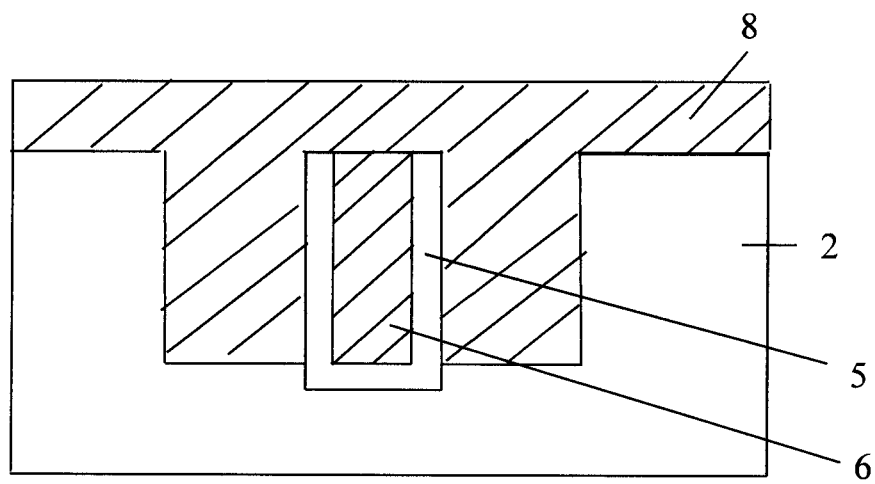
Figure 12:
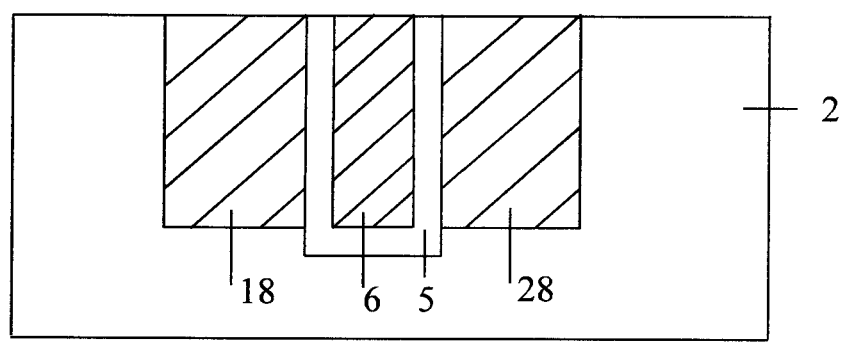

The process continues at block 109, where second and third capacitor conductor plate layers are deposited in the second and third trenches, respectively. The deposition of conductive material may be achieved in a single step, similarly to how the conductor 6 was deposited previously, by applying conductive material that covers all exposed surfaces, as is illustrated in FIG. 11, where conductive layer 8 fills both trenches and covers the exposed top surfaces of the substrate 2, the dielectric 5, and the first conductor 6. A top surface may then be planarized, again using CMP, giving a configuration such as that shown in FIG. 12. Once the excess conductive material has been removed, the remaining conductive material that was just deposited forms two separate areas of conductive material 18, 28. The outline of the capacitive structure has now been formed. A conductor 18 is separated from another conductor 6 by a dielectric 5, while a different portion of the same dielectric 5 also separates the conductor 6 from the conductor 28. As noted previously, due to the manufacturing process used, the dielectric 5 may have very low defect density and may be quite thin, such that the trench capacitor has an especially high capacitance.

Figure 13:
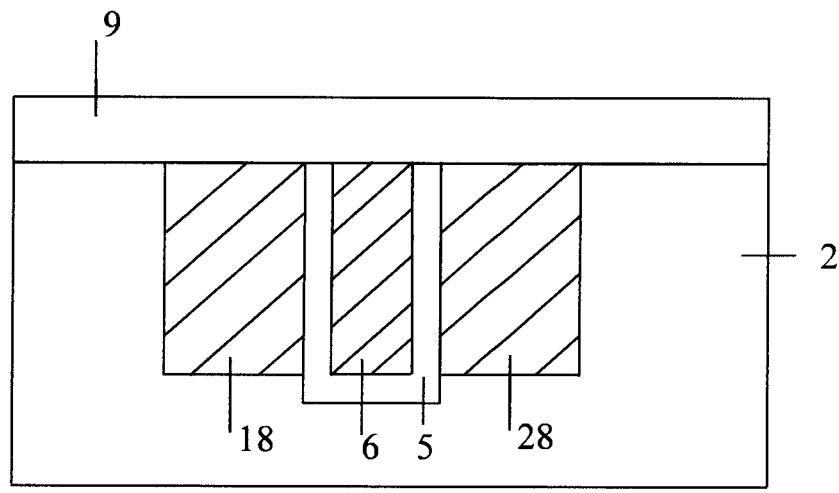
Figure 14:
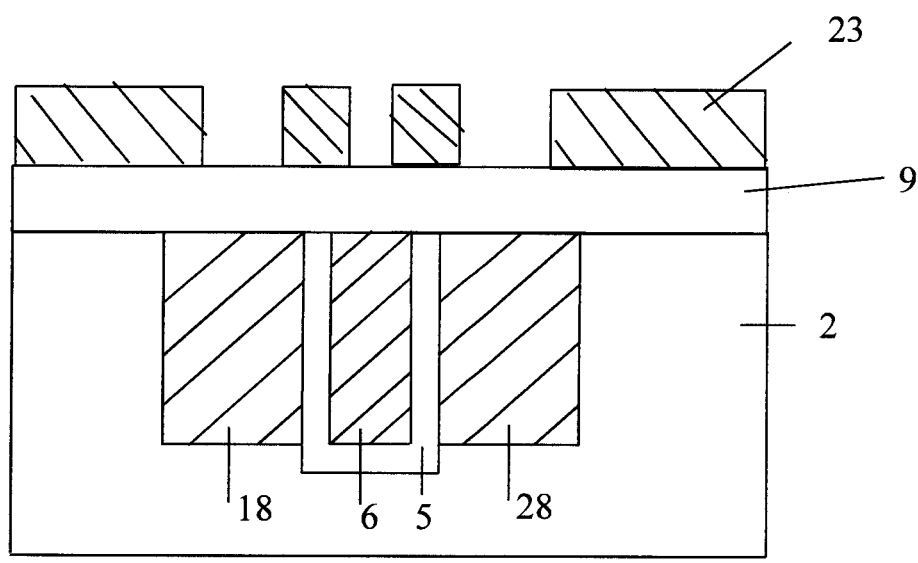
Figure 15:
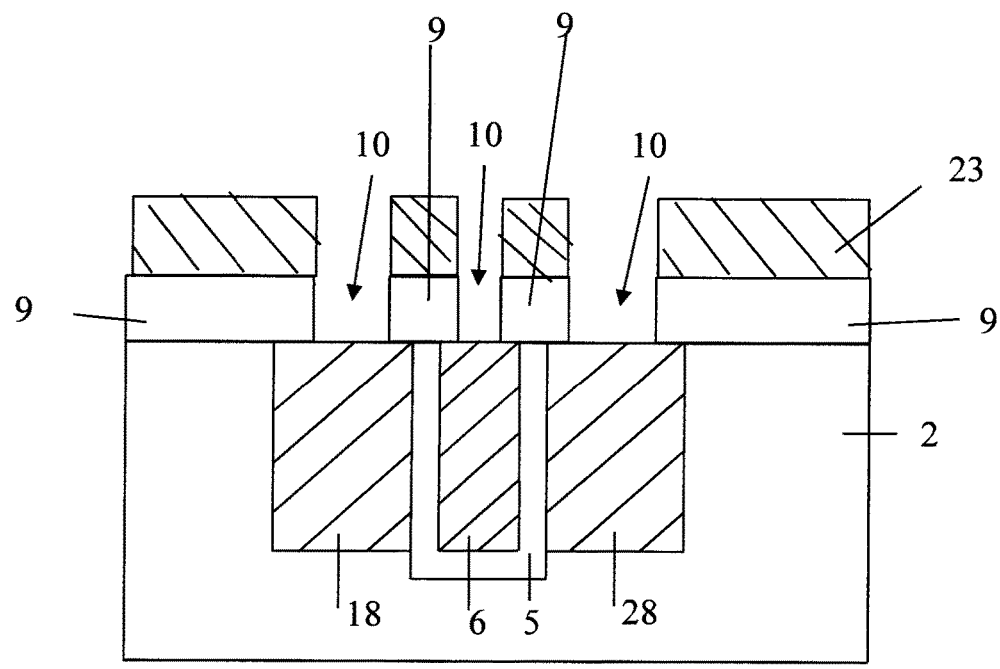
Figure 16:
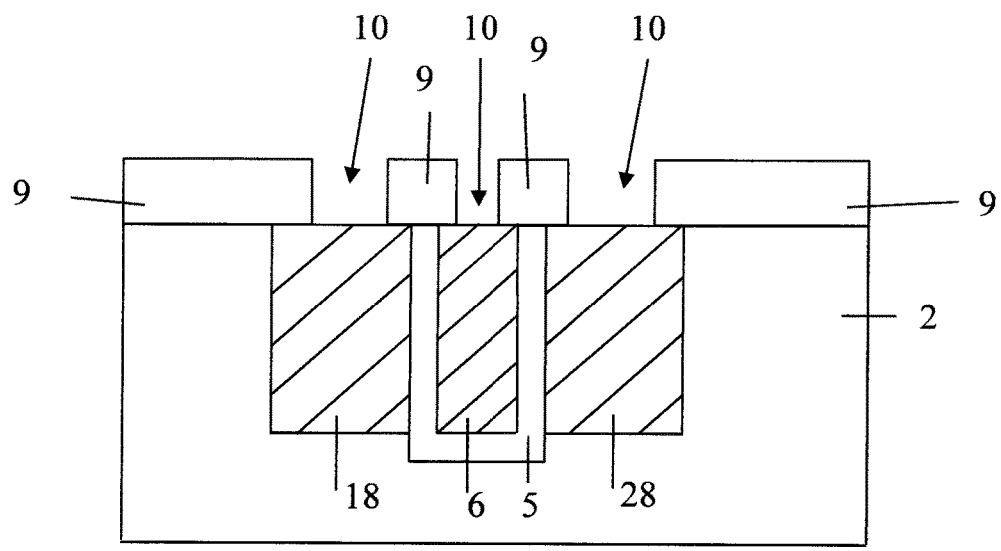
Figure 17:
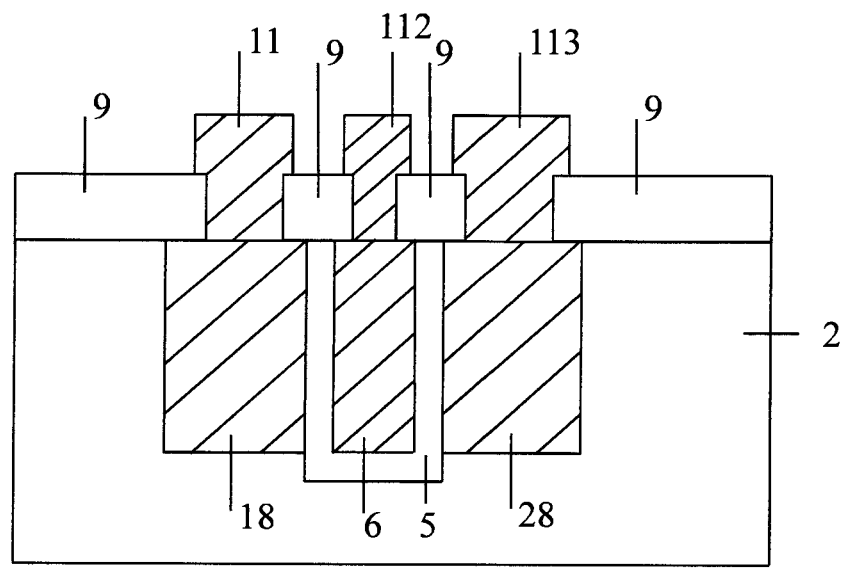
Figure 18:
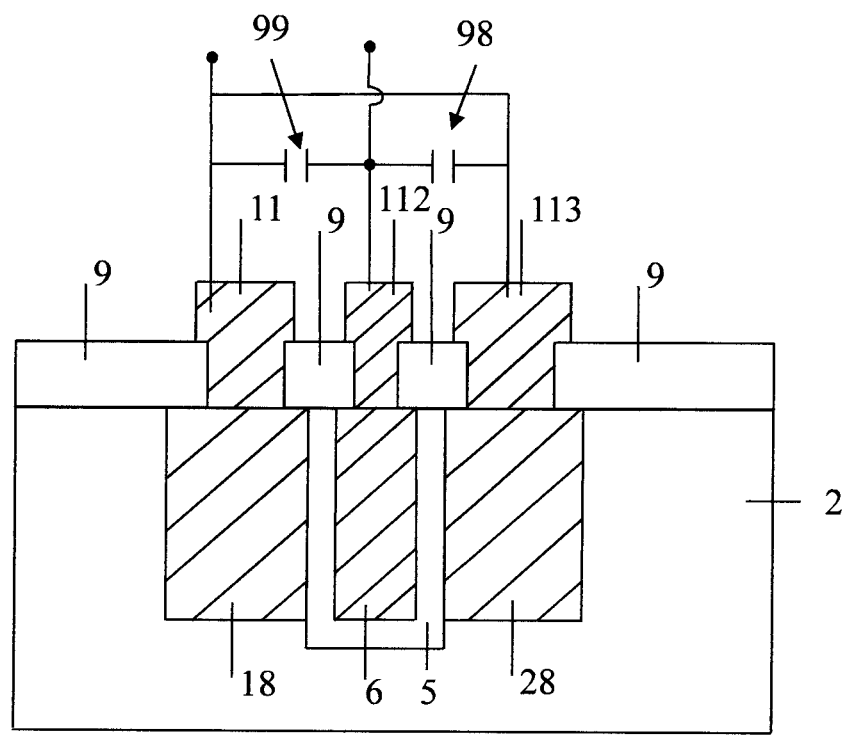

The process continues at block 111, where first and second electrical contacts are formed. As shown in FIG. 13, an inter-conductor dielectric 9 is deposited on top of the existing layers in a flat layer. The inter-conductor dielectric may be deposited by chemical vapor deposition of inorganic silicon dioxide. Alternatively, or in addition, silicon nitride may be used. Similarly, spin-on deposition of organic dielectric materials also may be employed. Contact holes are then formed in the inter-conductor dielectric 9. The holes are formed similarly to how trenches were formed previously, beginning with the deposition of a contact mask 23, as shown in FIG. 14. Contact holes 10, as shown in FIG. 15, are then formed by removing those portions of the inter-conductor dielectric layer 9 defined by the placement of the contact mask 23. The contact mask 23 is then removed, leaving a structure similar to that shown in FIG. 16. Conductors 11, 112, and 113 are then deposited through the contact holes, as shown in FIG. 17, making electrical contact with conductors 18, 6, and 28, respectively, and thereby forming electrodes. Conductors 11,112, and 113 can be formed in a similar fashion to conductors 18, 6, and 28. FIG. 18 shows the device of FIG. 17, with schematics overlaid indicating equivalent capacitors 99, 98 to the trench capacitors.

I claim:

1. A method of fabricating a semiconductor capacitor, the method comprising:
   forming a first trench in a top layer of a semiconductor substrate;
   forming a dielectric lining layer in the first trench by thermal oxidation;
   after forming the dielectric lining layer, depositing a first capacitor conductor plate layer on the dielectric lining layer in the first trench;
   forming a second trench in the top layer of the semiconductor substrate such that the dielectric lining layer is exposed within the second trench;
   forming a third trench in the top layer of the semiconductor substrate such that the dielectric lining layer is exposed within the third trench;
   depositing a second capacitor conductor plate layer in the second trench such that the first capacitor conductor plate layer and the second capacitor conductor plate layer are separated from each other on opposite sides of the dielectric lining layer; and
   depositing a third capacitor conductor plate layer in the third trench such that the first capacitor conductor plate layer and the third capacitor conductor plate layer are separated from each other on opposite sides of the dielectric lining layer.

2. A method in accordance with claim 1, wherein the dielectric lining layer is thermally grown by:
   depositing a first metal; and
   exposing the first metal to a pure oxygen environment at a temperature between 800 degrees Celsius and 1200 degrees Celsius.

3. A method in accordance with claim 1, wherein the semiconductor substrate comprises silicon, and wherein the dielectric lining layer is formed by exposing the substrate to a pure oxygen environment at a temperature between 800 degrees Celsius and 1200 degrees Celsius).

4. A method in accordance with claim 1, wherein forming the first trench in the semiconductor substrate comprises:
   depositing a first mask layer on the semiconductor substrate to define openings where said first trench will be formed in the semiconductor substrate;
   forming the first trench in the semiconductor substrate; and
   removing the first mask.

5. A method in accordance with claim 4, wherein depositing the first capacitor conductor plate layer on the dielectric lining layer in the first trench comprises:
   depositing the first capacitor conductor plate layer in the first trench; and
   planarizing the top of the substrate.

6. A method in accordance with claim 5, wherein forming the second and third trenches in the semiconductor substrate such that the dielectric lining layer is exposed within the second and third trenches comprises:
   depositing a second mask layer on the semiconductor substrate to define openings for the second trench and the third trench on each side of the dielectric-lined first trench;
   forming the second trench and the third trench on each side of the dielectric-lined first trench; and
   removing the second mask layer.

7. A method in accordance with claim 6, wherein depositing second and third capacitor conductor plate layers in the second and third trenches comprises:
   depositing the second and third capacitor conductor plate layers in the second and third trenches, respectively; and
   planarizing the top of the substrate.

8. A method in accordance with claim 7, the method further comprising forming a first electrical contact between the first capacitor conductor plate layer and the second capacitor conductor plate layer and forming a second electrical contact between the first capacitor conductor plate layer and the third capacitor conductor plate layer, wherein forming the first and second electrical contacts comprises:
   depositing a first inter-conductor dielectric layer on the semiconductor substrate, the first conductor plate layer, and the second conductor plate layer;
   depositing a third mask layer to define electrical connections of the capacitor;
   removing the inter-conductor dielectric material from areas defined by the third mask layer for electrical connections;
   removing the third mask layer; and
   depositing third conductor layers through the inter-conductor dielectric layer holes to make electrical contact to the first conductor plate layer and the second conductor plate layer.

9. A method in accordance with claim 7, wherein the first, second, and third capacitor conductor plate layers are deposited by:
   performing chemical vapor deposition; and
   electroplating.

10. A method in accordance with claim 7, wherein said the first mask and the second mask layer are formed by:
    depositing a sacrificial dielectric;
    depositing a photo-sensitive organic material;
    photo-engraving the organic material; and
    etching the sacrificial dielectric material to expose the substrate.

11. A method in accordance with claim 1, wherein the first, second, and third trenches are formed by chemical etching.

12. A method in accordance with claim 1, wherein forming the first, second, and third trenches includes ion implanting an N-doped layer into the substrate.

13. A method in accordance with claim 1, wherein forming the first, second, and third trenches includes ion implanting a P-doped layer into the substrate.

14. A method in accordance with claim 1, wherein at least one of the first capacitor conductor plate layer, the second capacitor conductor plate layer, and the third capacitor conductor plate layer comprises copper.

* * * * *